US009608454B2

(12) United States Patent
Sankar

(10) Patent No.: US 9,608,454 B2
(45) Date of Patent: Mar. 28, 2017

(54) WIRELESS POWER SYSTEM WITH A SELF-REGULATING WIRELESS POWER RECEIVER

(71) Applicant: WIPQTUS Inc., Cupertino, CA (US)

(72) Inventor: Ganapathy Sankar, Cupertino, CA (US)

(73) Assignee: WIPQTUS INC., Cupertino, CA (US)

( * ) Notice: Subject to any disclaimer, the term of this patent is extended or adjusted under 35 U.S.C. 154(b) by 614 days.

(21) Appl. No.: 14/094,750

(22) Filed: Dec. 2, 2013

(65) Prior Publication Data
US 2014/0152117 A1 Jun. 5, 2014

Related U.S. Application Data

(60) Provisional application No. 61/732,412, filed on Dec. 3, 2012.

(51) Int. Cl.
H02J 3/00 (2006.01)
H02J 5/00 (2016.01)
H03H 7/40 (2006.01)
H02J 7/02 (2016.01)
H04B 5/00 (2006.01)
H02J 7/00 (2006.01)

(52) U.S. Cl.
CPC .............. *H02J 5/005* (2013.01); *H02J 7/025* (2013.01); *H03H 7/40* (2013.01); *H04B 5/0031* (2013.01); *H04B 5/0037* (2013.01); *H04B 5/0081* (2013.01); *H02J 2007/0001* (2013.01)

(58) Field of Classification Search
CPC .. H02J 5/005; H02J 7/025; H02J 17/00; H02J 7/0042; H02J 50/10
See application file for complete search history.

(56) References Cited

U.S. PATENT DOCUMENTS

2005/0227648 A1* 10/2005 Tan ........................ H03J 1/0091
455/154.1
2007/0064457 A1* 3/2007 Perreault ............... H02M 3/155
363/78

(Continued)

Primary Examiner — Jung Kim
Assistant Examiner — Esayas Yeshaw
(74) Attorney, Agent, or Firm — Lipton, Weinberger & Husick; Ash Tankha

(57) ABSTRACT

A method and a system for self-regulating wireless power transmitted to a wireless power receiver (WPR) are provided. An auto-tuning network is operably coupled within the WPR. The auto-tuning network includes an impedance network that dynamically increases, decreases, or maintains an amount of the received wirelessly transmitted power by detecting changes in a rectifier load disposed in the WPR and/or in a rectifier output voltage in the WPR. The auto-tuning network self-regulates the wireless power received from a wireless power transmitter (WPT) obviating the need for conventional communication messages. The WPT is hence free from a modulator/demodulator block and an out-of-band communication block and operates over a limited operating range to enable a simpler design for passing electromagnetic compliance regulations. The WPR implements a receiver-maximum-power-signature algorithm for enabling the WPT to detect unsupported receivers, configure its operating point and range, and terminate power transmission when not needed by the WPR.

15 Claims, 5 Drawing Sheets

(56) References Cited

U.S. PATENT DOCUMENTS

| | | | |
|---|---|---|---|
| 2010/0110741 A1* | 5/2010 | Lin | H02J 5/005 363/127 |
| 2010/0283600 A1* | 11/2010 | Herbert | G08B 13/1427 340/539.1 |
| 2011/0021237 A1* | 1/2011 | He | H04W 52/52 455/522 |
| 2011/0080056 A1* | 4/2011 | Low | H02J 5/005 307/104 |
| 2011/0148215 A1* | 6/2011 | Marzetta | H02J 5/005 307/104 |
| 2012/0299769 A1* | 11/2012 | Li | H01Q 3/267 342/174 |

\* cited by examiner

WIRELESS POWER SYSTEM WITH A SELF-REGULATING WIRELESS POWER RECEIVER

CROSS REFERENCE TO RELATED APPLICATIONS

This application claims priority to and the benefit of provisional patent application No. 61/732,412 titled "Wireless Charging System With A Self-regulating Wireless Power Receiver", filed in the United States Patent and Trademark Office on Dec. 3, 2012. The specification of the above referenced patent application is incorporated herein by reference in its entirety.

BACKGROUND

In wireless power systems, a receiver and a transmitter communicate with one another using a communication protocol. In a conventional communication protocol, the receiver requests the transmitter to increase, decrease, maintain, stop, etc., the power provided to the receiver. The communication protocol can be "in band", for example, via a load modulation technique, or be "out of band", for example, via Bluetooth® of Bluetooth SIG, Inc., Wi-Fi® of the Wireless Ethernet Compatibility Alliance, etc.

Conventional communication protocol based power transfer control involves the transmitter changing its frequency across a few hundred kilo hertz (kHz). However, for some applications, it is not desirable to have a wide range of frequency of operation for wireless power transfer. Also, Federal Communications Commission (FCC) Part 15 Subpart C compliance testing becomes difficult because of varying frequency and the corresponding harmonics.

The conventional communication protocol between the receiver and the transmitter is also used to send, for example, distress signals, over voltage conditions, etc. The receiver takes a considerable amount of time to send a message and the transmitter takes a considerable amount of time to decipher the message and react to the sent message; therefore latency is inherent and there is a time delay. Also, the transmitter may decipher the message incorrectly, the message may be corrupted, etc., which could considerably delay the receiver in exiting from an over voltage condition. The receiver includes additional over voltage protection (OVP) circuitry that protects the receiver from excessive power during the time delay. The additional protection circuitry is rated to handle a certain amount of power, but if the power exceeds the rated power in the protection circuitry, the receiver may be susceptible to damages. Also, while operating, the protection circuitry causes a rise in temperature of the receiver which is detrimental to neighboring components, for example, a battery, etc.

Metal object detection is a key safety issue in wireless power delivery. Metal objects, for example, coins, pin-clips, etc., may couple and absorb some of the magnetic flux emanating from a transmitter when placed atop or in close proximity to the transmitter. Because of the eddy currents induced, the metal objects are heated. The heated metal objects cause damage to the plastic surface of the transmitter or burn skin on contact.

Therefore, there is a long felt but unresolved need for a method and a system that regulate the amount of wireless power delivered to a wireless power receiver without causing any damages to the wireless power receiver and the neighboring components of the wireless power receiver. Furthermore, there is a need for a method and a system that enable a transmitter to detect a metal object placed atop or in close proximity to the transmitter and terminate transmission of power.

SUMMARY OF THE INVENTION

A method and a system for self-regulating a wireless power receiver are provided. The method and the system disclosed herein regulates an amount of wireless power delivered to the wireless power receiver. The wireless power receiver is configured to receive wirelessly transmitted power. An auto-tuning network is operably coupled within the wireless power receiver. The auto-tuning network is configured to control and regulate the received wirelessly transmitted power. The auto-tuning network comprises an impedance network dynamically configured to increase, decrease, or maintain the amount of the received wirelessly transmitted power. The impedance network comprises one or more of passive electronic components, active electronic components, and electronic switches. The auto-tuning network is configured to detect changes in one or more of a load of a rectifier operably disposed in the self-regulating wireless power receiver, and in an output voltage of the rectifier, and to counteract the detected changes if the detected changes exceed a safe operating range.

The wireless power receiver, via the auto-tuning network, self-regulates to draw the required amount of power from a wireless power transmitter. In a sudden over voltage condition, for example, on account of a load transient, the auto-tuning network detects the over voltage and performs a quick remedial action. The auto-tuning network provides effective and faster over voltage protection (OVP) than possible with a scheme that relies on communicating with the wireless power transmitter. The need for a conventional communication protocol from the wireless power receiver to the wireless power transmitter is obviated since the functions that require the communication protocol to exist are handled by the auto-tuning network with significantly faster response times.

The method and the system disclosed herein also simplify the wireless power transmitter design. The wireless power transmitter does not need a conventional modulator/demodulator block and an out-of-band communication block typically contained in the wireless power transmitter for processing messages from and communicating messages to the wireless power receiver. The wireless power receiver, via the auto-tuning network, receives the required amount of wirelessly transmitted power from the wireless power transmitter without communicating messages to the wireless power transmitter. As a result, a few of the wireless protocol communication function blocks such as the modulator/demodulator block and the out-of-band communication block that are typically contained in the wireless power transmitter can be eliminated. The modulator/demodulator block and the out-of-band communication block are built with many passive components, active components, switches, and firmware resources. Therefore, elimination of the modulator/demodulator block and the out-of-band communication block simplifies and substantially reduces the cost of the wireless power transmitter design. Also, the wireless power transmitter can operate at a fixed operating point, for example, a frequency, a duty cycle etc., or within a narrow range and/or a set of operating points. Such an implementation will allow the wireless power transmitter to pass electromagnetic compliance (EMC) regulation easily.

In an embodiment, to avoid a heated metal object safety issue caused by eddy currents induced when metal objects are placed atop or in close proximity to the transmitter, the method and the system disclosed herein implement a receiver-maximum-power-signature algorithm that enables the wireless power transmitter to detect metal objects and unsupported receivers, and terminate transmission of power. The wireless power transmitter is aware of the maximum power needs of the wireless power receiver via the receiver-maximum-power-signature algorithm. The wireless power transmitter configures its circuitry, input voltage, operating point, etc., to deliver no more than the required level of maximum power to the wireless power receiver. Via the receiver-maximum-power-signature algorithm, the wireless power transmitter also terminates transmission of wireless power when the wireless power receiver does not need any further power or if the wireless power receiver is removed, thereby increasing the overall efficiency of wireless power delivery.

By incorporating the self-regulating wireless power receiver, the receiver-maximum-power-signature algorithm and the simplified, limited operating point wireless power transmitter, the method and the system disclosed herein allow building of a wireless power system that provides wireless power to an electronic device without the need for a conventional communication protocol between the wireless power transmitter and the wireless power receiver.

DETAILED DESCRIPTION OF THE INVENTION

Figure 1:
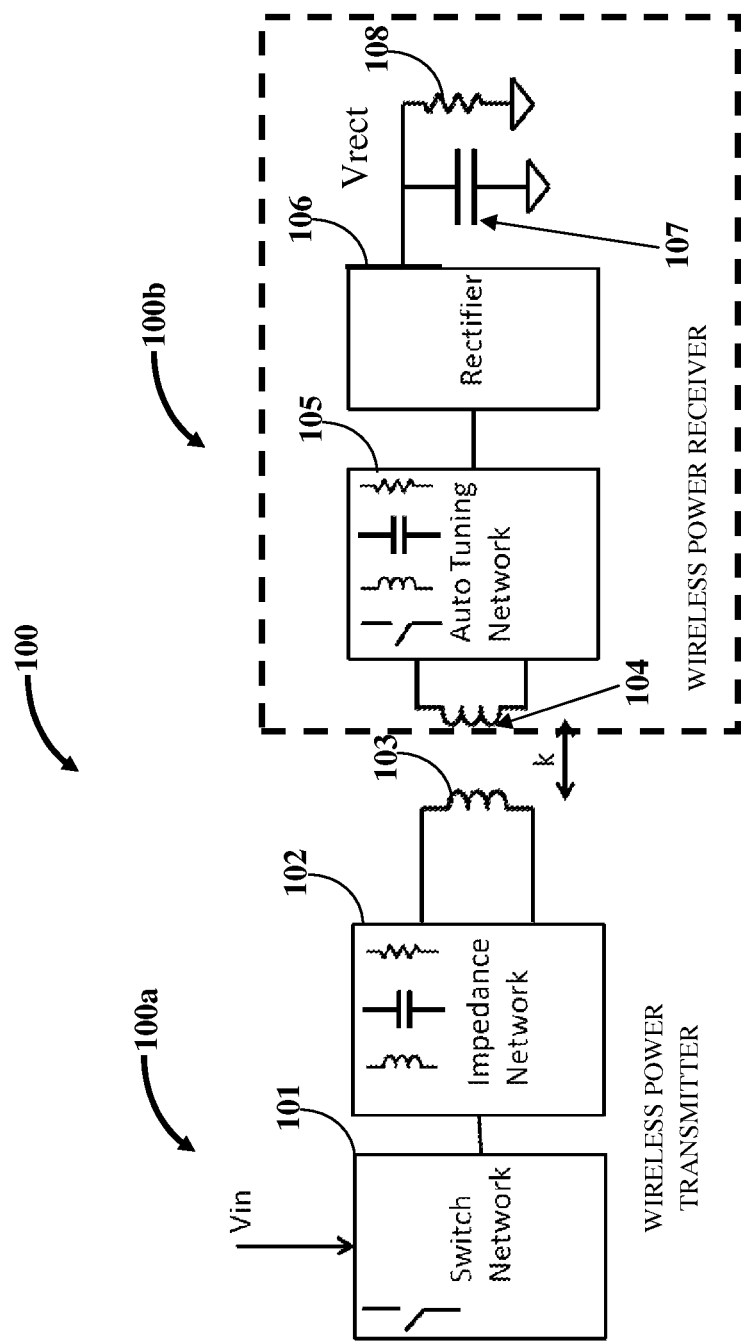
FIG. 1 exemplarily illustrates a schematic diagram of a wireless power system comprising a wireless power transmitter and a self-regulating wireless power receiver.

FIG. 1 exemplarily illustrates a schematic diagram of a wireless power system 100 comprising a wireless power transmitter 100a and a self-regulating wireless power receiver 100b. The wireless power receiver 100b of the wireless power system 100 employs an auto-tuning scheme to control the amount of power that the wireless power receiver 100b receives. A switch network 101 is configured to receive an input power and an input voltage. An impedance network 102 is connected between the switch network 101 and a transmitter coil 103. The input power wirelessly transmitted to the wireless power receiver 100b is magnetic field based using inductive coupling. The transmitter coil 103 is used for inducing a magnetic field to a coupling region for providing energy transfer to the wireless power receiver 100b. The wireless power transmitter 100a transmits input power to the wireless power receiver 100b by emanating the magnetic field using the transmitter coil 103. The wireless power receiver 100b comprises a receiver coil 104 that picks up the magnetic field with a certain coupling coefficient that exists between the transmitter coil 103 and the receiver coil 104, an auto-tuning network 105 that regulates power received by the wireless power receiver 100b, and a rectifier 106 that rectifies alternating current (AC) to obtain direct current (DC). A capacitor 107 in the wireless power receiver 100b filters stray AC components. A pure DC output is received across a rectifier load 108.

The auto-tuning network 105 controls and regulates the wireless input power received by the wireless power receiver 100b. The auto-tuning network 105 in the wireless power receiver 100b controls power transfer, protects against over voltage, and provides improved load transient response. The auto-tuning network 105 comprises an impedance network that is dynamically tuned to increase, decrease, or maintain the amount of wireless input power received by the wireless power receiver 100b. The impedance network comprises a combination of passive components such as inductors, capacitors, resistors, etc., active components such as metal oxide semiconductor field effect transistors (MOSFETs), bipolars, operational amplifiers, an analog to digital converter (ADC), microcontrollers (MCUs), etc., and switches.

The auto-tuning network 105 regulates the output voltage Vrect of the rectifier 106 across the rectifier load 108 that can swing instantaneously and exceed recommended limits when the load across the rectifier 106 changes. By performing this action, the auto-tuning network 105 protects the wireless power receiver 100b from an unsafe condition. The auto-tuning network 105 senses the changes in the rectifier load 108 and/or the output voltage Vrect of the rectifier 106 and quickly counteracts the changes if the changes exceed a safe operating range. For example, the auto-tuning network 105 rapidly tunes to increase the wireless input power at the wireless power receiver 100b when the rectifier output voltage Vrect drops below the safe operating range. In another example, the auto-tuning network 105 rapidly tunes to decrease the wireless input power at the wireless power receiver 100b when the rectifier output voltage Vrect increases above the safe operating range. The output voltage Vrect of the rectifier 106 is therefore maintained within a safe range without the need for a more elaborate over voltage protection (OVP) scheme. Changes in the auto-tuning network 105 affect the reflected impedance seen by the wireless power transmitter 100a. This alters the wireless power transmitted by the wireless power transmitter 100a to the wireless power receiver 100b.

Figure 2A:
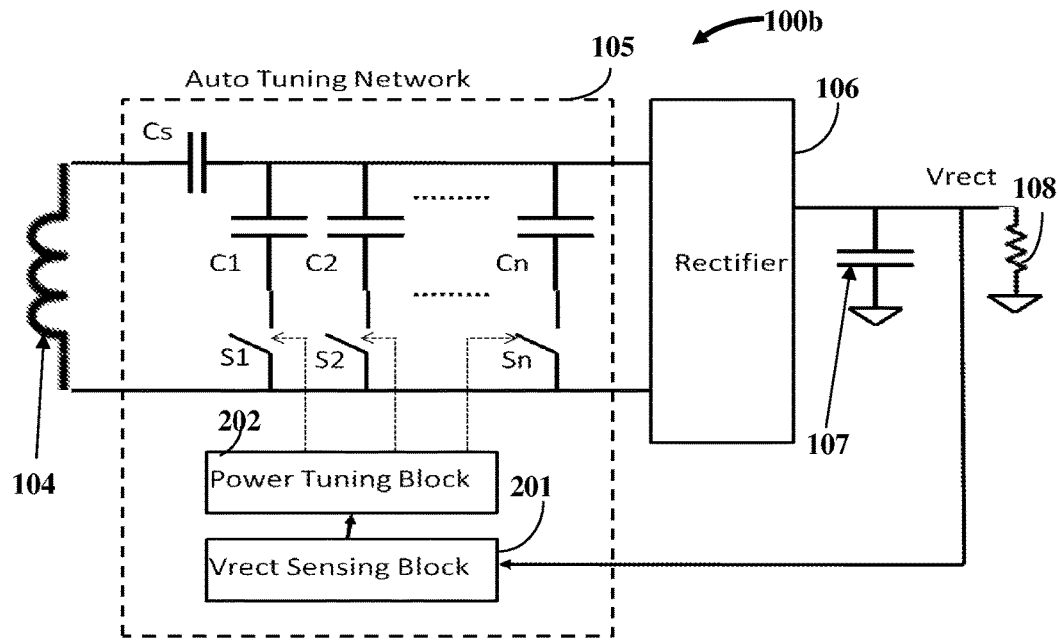
FIG. 2A exemplarily illustrates a first embodiment of an auto-tuning network of the self-regulating wireless power receiver.

FIG. 2A exemplarily illustrates a first embodiment of the auto-tuning network 105 of the self-regulating wireless power receiver 100b. In this embodiment, the auto-tuning network 105 includes a Vrect sensing block 201, a power tuning block 202, a series resonant capacitor Cs, and a parallel switch-capacitor network consisting of "n" parallel capacitors C1, C2, . . . , Cn and "n" switches S1, S2, . . . , Sn. In this embodiment, the parallel switch-capacitor network is connected across two alternating current (AC) IOs of the rectifier 106. The Vrect sensing block 201 measures the rectifier output voltage Vrect constantly or periodically. The power tuning block 202 compares the measured voltage Vrect with its configured threshold levels. Based on the comparison, the power tuning block 202 activates switches S1, S2, . . . , Sn. The switches may be turned on or turned off or may be pulsed on and off at a certain frequency and duty cycle. When a switch S1, S2, . . . , Sn is turned on, the associated capacitor C1, C2, . . . , Cn on the same leg is activated and impacts the reflected impedance of the wireless power receiver 100b and hence the amount of wireless power received. The Vrect sensing block 201 senses the changes in the rectifier output voltage Vrect and the power tuning block 202 quickly counteracts the changes if the changes exceed a safe operating range. For example, if the rectifier output voltage Vrect drops below the safe operating range, the power tuning block 202 turns on switches S1 and S2 to increase the amount of wireless power received. The power tuning block 202 progressively turns on more switches until wireless power received restores the output voltage Vrect of the rectifier 106 to the safe operating range. In another example, if the rectifier output voltage Vrect increases above the safe operating range, the power tuning block 202 progressively decreases the on-time duty cycle of switches S1, S2, . . . , Sn to decrease the level of wireless power received until Vrect is restored to the safe operating range. As an additional embodiment, the resonant series capacitor Cs may not be present and the receiver coil 104 is connected directly to the parallel switch-capacitor network.

Figure 2B:
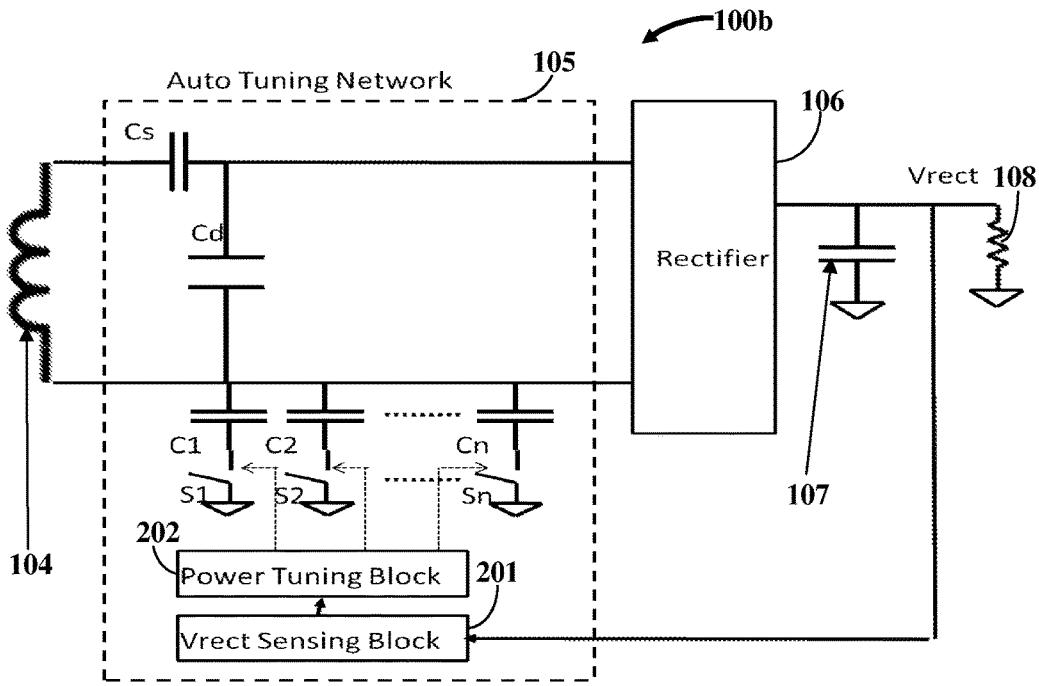
FIG. 2B exemplarily illustrates a second embodiment of the auto-tuning network of the self-regulating wireless power receiver.

FIG. 2B exemplarily illustrates a second embodiment of the auto-tuning network 105 of the self-regulating wireless power receiver 100b. In this embodiment, the auto-tuning network 105 includes a Vrect sensing block 201, a power tuning block 202, a series resonant capacitor Cs, a parallel resonant capacitor Cd, and a parallel switch-capacitor network consisting of "n" parallel capacitors C1, C2, . . . , Cn and "n" switches S1, S2, . . . , Sn. In this embodiment, the parallel switch-capacitor network is connected asymmetrically between one of the alternating current (AC) IOs of the rectifier 106 and ground. The Vrect sensing block 201 measures the rectifier output voltage Vrect constantly or periodically. The power tuning block 202 compares the measured voltage Vrect with its configured threshold levels. Based on the comparison, the power tuning block 202 activates switches S1, S2, . . . , Sn. The switches may be turned on or turned off, or may be pulsed on and off at a certain frequency and duty cycle. When a switch S1, S2, . . . , Sn is turned on, the associated capacitor C1, C2, . . . , Cn on the same leg is activated and impacts the reflected impedance of the wireless power receiver 100b and hence the amount of wireless power received. The Vrect sensing block 201 senses the changes in the rectifier output voltage Vrect and the power tuning block 202 quickly counteracts the changes if the changes exceed a safe operating range. For example, if the rectifier output voltage Vrect drops below the safe operating range, the power tuning block 202 turns on switches S1 and S2 to increase the amount of wireless power received. The power tuning block 202 progressively turns on more switches until wireless power received restores the output voltage Vrect of the rectifier 106 to the safe operating range. In another example, if the rectifier output voltage Vrect increases above the safe operating range, the power tuning block 202 progressively decreases the on-time duty cycle of switches S1, S2, . . . , Sn, to decrease the level of wireless power received until Vrect is restored to the safe operating range. As an additional embodiment, the resonant series capacitor Cs may not be present and the receiver coil 104 is connected directly across Cd.

Figure 2C:
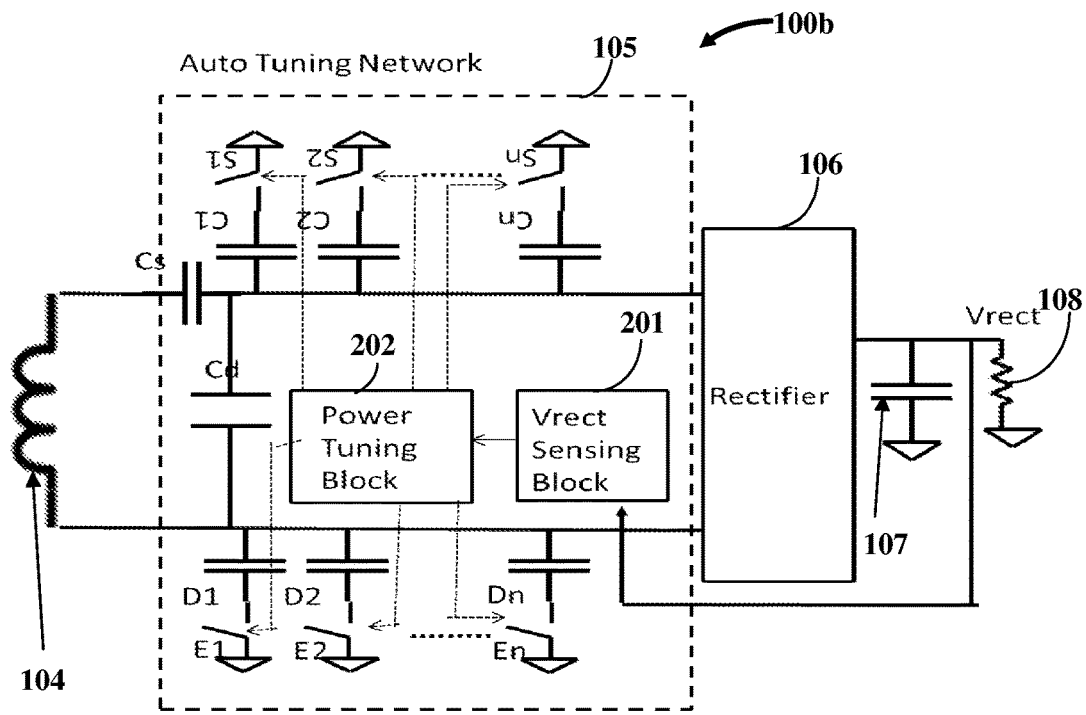
FIG. 2C exemplarily illustrates a third embodiment of the auto-tuning network of the self-regulating wireless power receiver.

FIG. 2C exemplarily illustrates a third embodiment of the auto-tuning network 105 of the self-regulating wireless power receiver 100b. In this embodiment, the auto-tuning network 105 includes a Vrect sensing block 201, a power tuning block 202, a series resonant capacitor Cs, a parallel resonant capacitor Cd, a first parallel switch-capacitor network consisting of "n" parallel capacitors C1, C2, . . . , Cn and "n" switches S1, S2, . . . , Sn, and a second parallel switch-capacitor network consisting of "n" parallel capacitors D1, D2, . . . , Dn and "n" switches E1, E2, . . . , En. In this embodiment, the two parallel switch-capacitor networks in combination together are connected symmetrically between both the alternating current (AC) IOs of the rectifier 106 and ground. The Vrect sensing block 201 measures the rectifier output voltage Vrect constantly or periodically. The power tuning block 202 compares the measured voltage Vrect with its configured threshold levels. Based on the comparison, the power tuning block 202 activates switches S1, S2, . . . , Sn and switches E1, E2, . . . , En. The switches may be turned on or turned off, or may be pulsed on and off at a certain frequency and duty cycle. When a switch, for example, S1, is turned on, the associated capacitor, for example, C1 on the same leg is activated and impacts the reflected impedance of the wireless power receiver 100b and hence the amount of wireless power received. The Vrect sensing block 201 senses the changes in the rectifier output voltage Vrect and the power tuning block 202 quickly counteracts the changes if the changes exceed a safe operating range. For example, if the rectifier output voltage Vrect drops below the safe operating range, the power tuning block 202 turns on switches S1 and E1 to increase the amount of wireless power received. The power tuning block 202 progressively turns on more switches symmetrically until wireless power received restores the output voltage Vrect of the rectifier 106 to the safe operating range. In another example, if the rectifier output voltage Vrect increases above the safe operating range, the power tuning block 202 progressively decreases the on-time duty cycle of switches S1, E1 to decrease the level of wireless power received until Vrect is restored to the safe operating range. As an additional embodiment, the resonant series capacitor Cs may not be present and the receiver coil 104 is connected directly across Cd.

Figure 2D:
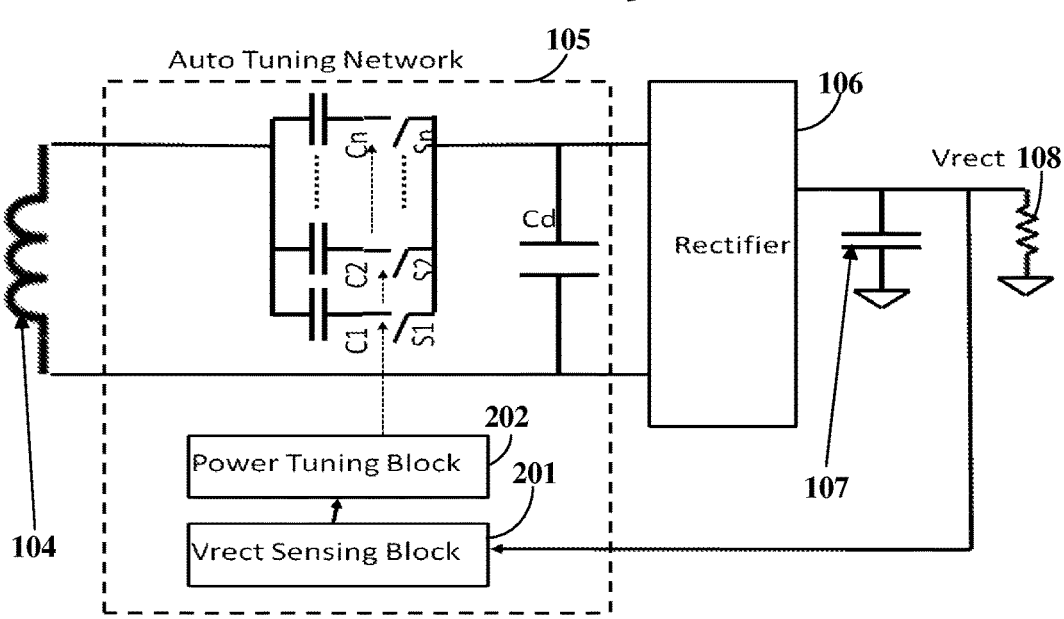
FIG. 2D exemplarily illustrates a fourth embodiment of the auto-tuning network of the self-regulating wireless power receiver.

FIG. 2D exemplarily illustrates a fourth embodiment of the auto-tuning network 105 of the self-regulating wireless power receiver 100b. In this embodiment, the auto-tuning network 105 includes a Vrect sensing block 201, a power tuning block 202, a paralleled resonant capacitor Cd, and a parallel switch-capacitor network consisting of "n" parallel capacitors C1, C2, . . . , Cn and "n" switches S1, S2, . . . , Sn. In this embodiment, the parallel switch-capacitor network is connected between the receiver coil 104 and one of the alternating current (AC) IOs of the rectifier 106. The Vrect sensing block 201 measures the rectifier output voltage Vrect constantly or periodically. The power tuning block 202 compares the measured voltage Vrect with its configured threshold levels. Based on the comparison, the power tuning block 202 activates switches S1, S2, . . . , Sn. The switches may be turned on or turned off, or may be pulsed on and off at a certain frequency and duty cycle. When a switch S1, S2, . . . , Sn is turned on, the associated capacitor C1, C2, . . . , Cn on the same leg is activated and impacts the reflected impedance of the wireless power receiver 100b and hence the amount of wireless power received. The Vrect sensing block 201 senses the changes in the rectifier output voltage Vrect and the power tuning block 202 quickly counteracts the changes if the changes exceed a safe operating range. For example, if the rectifier output voltage Vrect drops below the safe operating range, the power tuning block 202 turns on switches S1 and S2 to increase the amount of wireless power received. The power tuning block 202 progressively turns on more switches until wireless power received restores the output voltage Vrect of the rectifier 106 to the safe operating range. In another example, if the rectifier output voltage Vrect increases above the safe operating range, the power tuning block 202 progressively decreases the on-time duty cycle of switches S1, S2, . . . , Sn, to decrease the level of wireless power received until Vrect is restored to the safe operating range. As an additional embodiment, the resonant parallel capacitor Cd may not be present in certain applications.

Figure 3:
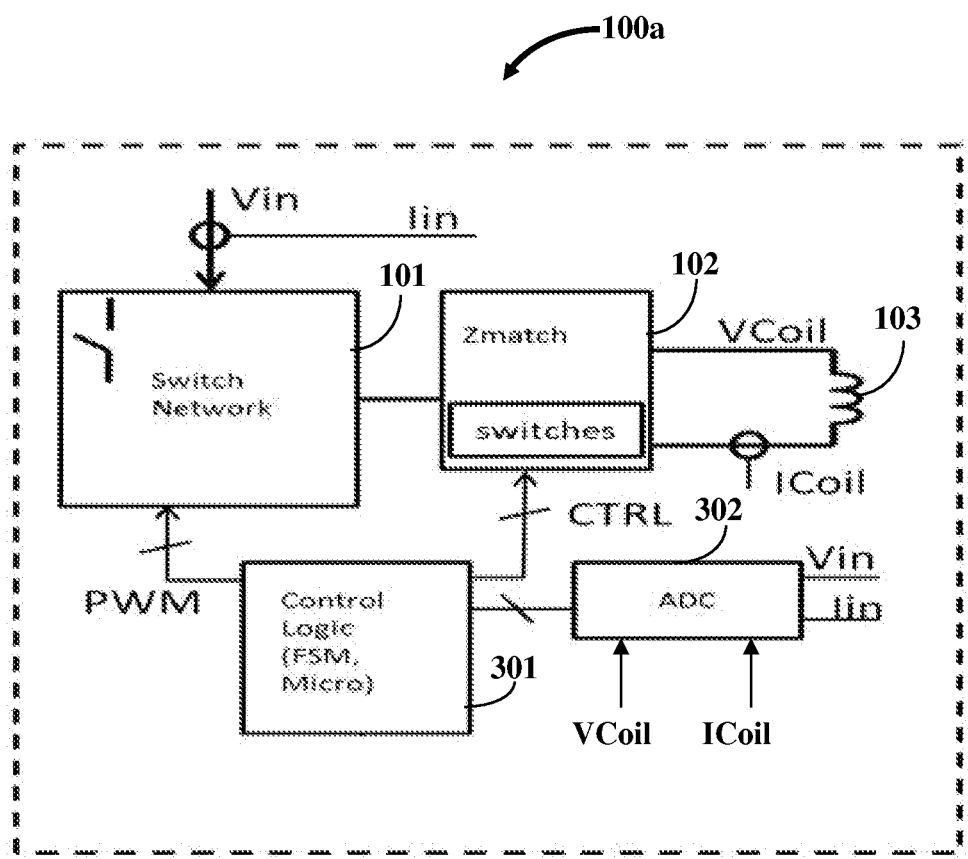
FIG. 3 exemplarily illustrates a schematic diagram of a wireless power transmitter without a modulator/demodulator block and an out-of-band communication block.

FIG. 3 exemplarily illustrates a schematic diagram of a wireless power transmitter 100a without a modulator/demodulator block and an out-of-band communication block. The wireless power transmitter 100a disclosed herein comprises a switch network 101 configured to receive an input voltage and an input current from a voltage source. The wireless power transmitter 100a further comprises an impedance network 102 represented as a Zmatch block connected between the switch network 101 and a transmitter coil 103. The impedance network 102 comprises one or more of passive electronic components, for example, a resistor, a capacitor, a magnetic device, a transducer, etc., active electronic components, for example, a diode, a transistor such as a metal oxide semiconductor field effect transistor (MOSFET), a bipolar transistor, operational amplifiers, an optoelectronic device, etc.; and electronic switches. The wireless power transmitter 100a further comprises an analog to digital converter (ADC) 302, where the ADC 302 is operably coupled to a control logic circuit 301 of the wireless power transmitter 100a. The ADC 302 measures various parameters such as the input voltage Vin, the input current Iin, the voltage VCoil of the transmitter coil 103, the temperature of the transmitter coil 103, the current ICoil of the transmitter coil 103, etc., and feeds such information in real time to the control logic circuit 301. The control logic circuit 301 processes all the collected real time information via its control circuits, state machines, algorithms, firmware, etc., and in turn outputs a pulse width modulation (PWM) signal to the switch network 101.

The wireless power transmitter 100a scans and detects the presence of a wireless power receiver 100b, exemplarily illustrated in FIG. 1, in its vicinity. On detecting the presence of the wireless power receiver 100b, the wireless power transmitter 100a configures the switch network 101 and tunes the impedance network 102 to create sufficient field linkage, for example, a magnetic flux field linkage to transmit power wirelessly to the wireless power receiver 100b. In the wireless power system 100 exemplarily illustrated in FIG. 1, the wireless power transmitter 100a does not contain a conventional modulator/demodulator block which is typically needed for processing in-band messages from and communicating in-band messages to the wireless power receiver 100b in a wireless power protocol of the wireless power receiver 100b. The wireless power transmitter 100a disclosed herein also does not contain a conventional out-of-band communication block which is also typically used for processing out-of-band messages from and communicating out-of-band messages to the wireless power receiver 100b in a wireless power protocol of the wireless power receiver 100b.

The wireless power receiver 100b, using the auto-tuning network 105 exemplarily illustrated in FIG. 1 and FIGS. 2A-2D is configured to safely receive the wirelessly transmitted power from the wireless power transmitter 100a via the self regulatory auto-tuning network 105. The wireless power receiver 100b, via the auto-tuning network 105, receives the required amount of wirelessly transmitted power from the wireless power transmitter 100a without communicating conventional messages such as increase power, decrease power, maintain power, stop power, etc., to the wireless power transmitter 100a. The need for such conventional communication messages from the wireless power receiver 100b to the wireless power transmitter 100a is obviated since the end result targeted by those communication messages is achieved by the auto-tuning network 105 with substantially faster response times. The elimination of such conventional communication messages enables simplification of the design of the wireless power transmitter 100a and the wireless power receiver 100b by elimination of circuitry, for example, the modulator/demodulator block and the out-of-band communication block, and firmware to process, error-correct, decipher, and respond to those communication messages. Because of such a simplification, the wireless power system 100 can be built at a lower cost and a smaller size and can operate at higher efficiency. Also, because of the auto-tuning network 105 operably coupled within the self-regulating wireless power receiver 100b, the wireless power transmitter 100a can operate at a fixed operating point, for example, at a fixed frequency and duty cycle, or within a narrow range and/or set of operating points, which enables the wireless power transmitter 100a to implement and pass electromagnetic compliance (EMC) regulations more easily.

When metal objects are placed atop or in close proximity of the wireless power transmitter 100a, eddy currents are induced in the metal object as a result of the magnetic field emanating from the wireless power transmitter 100a. When the metal object has low resistivity, these eddy currents cause the metal object to heat up leading to a safety issue. The wireless power transmitter 100a has various algorithms for detecting metal objects and turning off power to eliminate this heated metal object safety issue. In addition, the wireless power transmitter 100a turns on substantial power delivery only when the wireless power transmitter 100a senses a good wireless power receiver 100b. This enables low standby power consumption at the wireless power transmitter 100a when there is not any good wireless power receiver 100b in the wireless power transmitter's 100a vicinity. Additionally, the wireless power transmitter 100a ensures that a careful level of power is delivered to the wireless power receiver 100b without compromising required performance and without overwhelming and damaging the wireless power receiver 100b with too much power. In an embodiment, so as to avoid hot metal objects, to have low standby power, and to have safe power delivery to the wireless power receiver 100b, the method and the wireless power system 100 disclosed herein implement a receiver-maximum-power-signature algorithm. This algorithm enables the wireless power transmitter 100a to detect metal objects and terminate transmission of power. This algorithm enables the wireless power transmitter 100a to detect the presence of a good wireless power receiver 100b and then start providing substantial power. Via this algorithm, the wireless power transmitter 100a is also aware of the maximum power needs of the wireless power receiver 100b. The wireless power transmitter 100a then configures its operating point to deliver the required level of maximum power. Via the receiver-maximum-power-signature algorithm, the wireless power transmitter 100a can also terminate transmission of wireless power when the wireless power receiver 100b does not need any further power, thereby increasing the overall efficiency of wireless power delivery.

Figure 4:
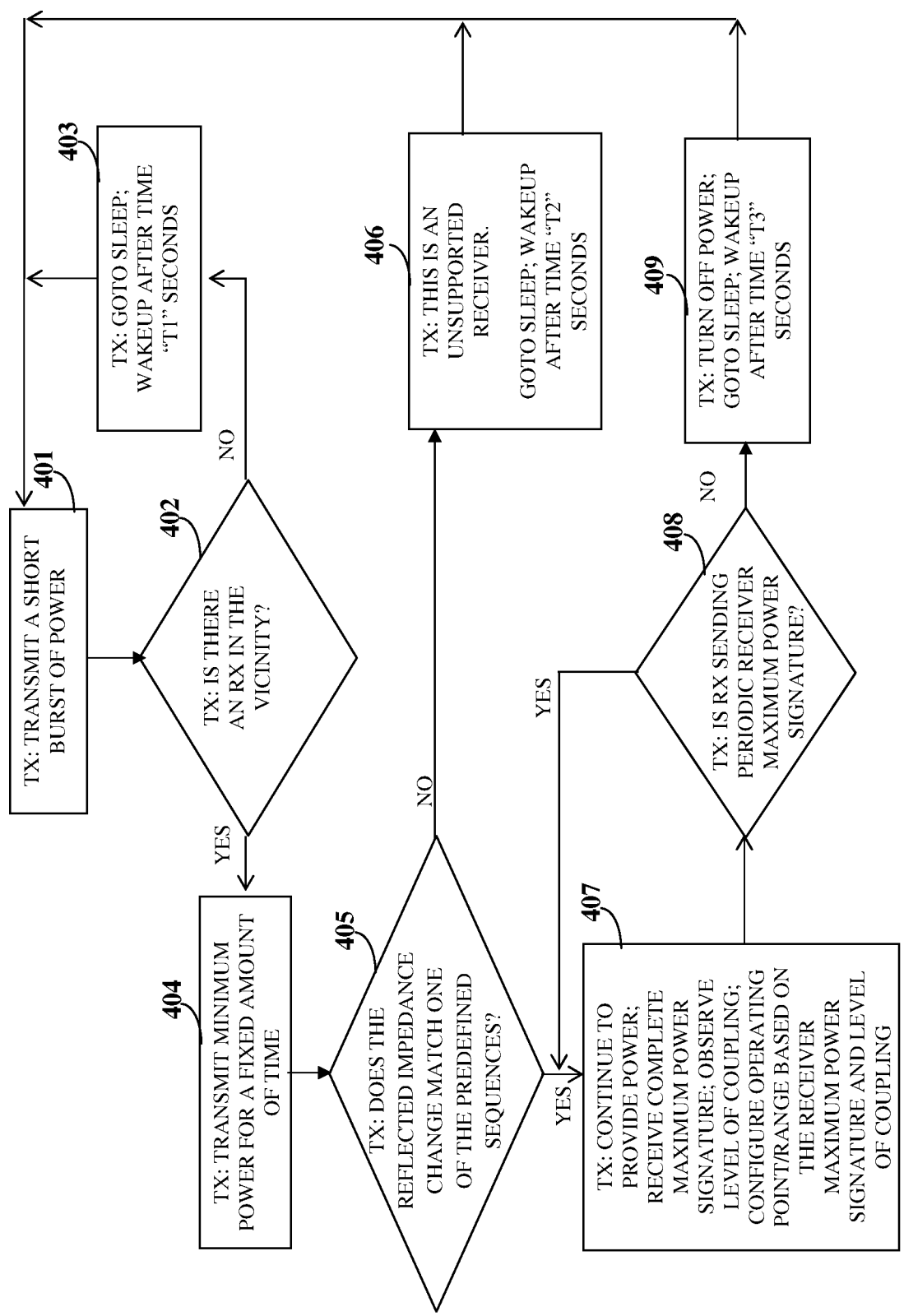
FIG. 4 exemplarily illustrates a flow chart comprising the steps for establishing a stable and optimal power transfer from the wireless power transmitter to the wireless power receiver.

FIG. 4 exemplarily illustrates a flow chart comprising the steps for establishing a stable and optimal power transfer from the wireless power transmitter 100*a* to the wireless power receiver 100*b* exemplarily illustrated in FIG. 1, via the receiver-maximum-power-signature algorithm. On reset, the process begins with the wireless power transmitter 100*a* transmitting 401 a short burst of wireless power to detect 402 the presence of a wireless power receiver 100*b* in its vicinity. If a wireless power receiver 100*b* is not detected, the wireless power transmitter 100*a* shuts down 403 into a deep sleep after programming a timer to restore the wireless power transmitter 100*a* back to its normal operating mode after "T1" seconds. If a wireless power receiver 100*b* is detected, the wireless power transmitter 100*a* transmits 404 a minimum amount of power to the wireless power receiver 100*b* for a fixed time interval.

On receiving initial power from the wireless power transmitter 100*a*, the self-regulating wireless power receiver 100*b* initiates implementation of the receiver-maximum-power-signature algorithm. The receiver-maximum-power-signature algorithm defines instructions for varying, that is, increasing and decreasing the input impedance of the wireless power receiver 100*b* by a specified amount for predetermined intervals of time. For example, as per the receiver-maximum-power-signature algorithm, the self-regulating wireless power receiver 100*b* may increase its input impedance by about 10% for 5 milliseconds and then reduce its input impedance by about 10% for 5 milliseconds and may repeat this pattern about 10 times for a total time period of 100 milliseconds. The input impedance of the wireless power receiver 100*b* is the impedance of the wireless power receiver 100*b* when looking into the wireless power receiver 100*b* from the receiving coil 104. The input impedance of the wireless power receiver 100*b* is varied by varying its real and/or reactive parts. The reactive part of the input impedance of the wireless power receiver 100*b* is varied via changes in the auto-tuning network 105 of the wireless power receiver 100*b* as exemplarily illustrated in FIGS. 2A-2D and described previously. The real part of the input impedance of the wireless power receiver 100*b* is varied by adding and removing resistive loads in parallel with the actual rectifier load 108. As a result of the changes in the input impedance of the wireless power receiver 100*b*, the reflected impedance as seen by the wireless power transmitter 100*a* is consequently increased or decreased. The receiver-maximum-power-signature algorithm controls the pattern of input impedance change and via these impedance changes, the wireless power receiver 100*b* conveys its maximum-power-signature to the wireless power transmitter 100*a*.

On detecting a wireless power receiver 100*b*, the wireless power transmitter 100*a* provides initial power to the wireless power receiver 100*b* for a fixed amount of time, for example, 100 milliseconds. While providing initial power, the wireless power transmitter 100*a* tracks parameters such as transmitter coil voltage VCoil, transmitter coil current ICoil, etc., to observe changes in the reflected impedance caused as a result of changes in the input impedance of the wireless power receiver 100*b*. The reflected impedance changes may also be observed by tracking the voltage and/or current flowing in the switch network 101 or other parts of the wireless power transmitter 100*a*. Via tracking parameters that are dependent on the reflected impedance, the wireless power transmitter 100*a* can determine 405 whether the wireless power receiver 100*b* is a metal object. When the reflected impedance changes follows one of the predefined receiver-maximum-power-signatures for a predetermined fraction of the initial power time period, for example, 50% of the initial power time period which would be 50 milliseconds, the wireless power transmitter 100*a* recognizes that the wireless power transmitter 100*a* is transmitting power to a safe non-metal object wireless power receiver 100*b* and hence, continues to provide 407 power.

While providing power, the wireless power transmitter 100*a* receives the complete receiver-maximum-power-signature from the wireless power receiver 100*b*. The wireless power transmitter 100*a* decodes and determines the maximum power level of the wireless power receiver 100*b* from that signature. Based on the determined maximum power level, the wireless power transmitter 100*a* selects and set its operating point and operating range by configuring its switch network 101, the impedance network 102, and the transmitter coil 103 to be able to deliver that maximum amount of power. For example, if the received maximum-power-signature is "10101010101010101010", the wireless power transmitter 100*a* determines the maximum power level to be 10 Watts and configures its operating frequency to (say) 130 kHz and its duty cycle to not exceed 40% so as to deliver a maximum of 10 W to the wireless power receiver 100*b*. Additionally, based on the strength of the reflected impedance changes, the wireless power transmitter 100*a* senses the level of magnetic field flux linkage coupling between the wireless power transmitter 100*a* and the wireless power receiver 100*b*. The wireless power transmitter 100*a* considers the sensed level of coupling when selecting and setting its operating point and range. For example, when the level of coupling is strong, to deliver a maximum power of 10 Watts, the wireless power transmitter 100*a* may configure itself to operate at a fixed frequency of 130 khz and a duty cycle not to exceed 40%. When the level of coupling is weak, to deliver a maximum power of 10 Watts, the wireless power transmitter 100*a* may configure itself to operate at a fixed frequency of 128 khz and allow a duty cycle of up to 50%.

When the reflected impedance changes do not follow any of the predefined receiver-maximum-power-signatures for the predetermined fraction of the initial power time period, the wireless power transmitter 100*a* recognizes the presence of an unsupported object, potentially, an unsafe, metal object and hence, terminates further power transmission. That is, if the wireless power receiver 100*b* is a metal object or some unknown object, the wireless power transmitter 100*a* shuts down 406 into a deep sleep after programming a timer to restore the wireless power transmitter 100*a* back to its normal operating mode after "T2" seconds.

The input impedance of a metal object does not vary in sync with the predefined receiver-maximum-power-signature patterns, thereby virtually guaranteeing that the wireless power transmitter 100*a* will not falsely recognize a metal object as a good wireless power receiver 100*b*. As per the receiver-maximum-power-signature algorithm, the wireless power receiver 100*b* modulates its input impedance as per its maximum power signature periodically, for example, every 0.5 seconds. For the purpose of the receiver-maximum-power-signature algorithm, the wireless power receiver 100*b* carefully adopts only those input impedance changes which preserve the rectifier output voltage Vrect in the safe operating range.

The wireless power transmitter 100*a* checks 408 whether the wireless power receiver 100*b* is sending the maximum power signature periodically. The wireless power transmitter 100*a* continues to provide power as long as the wireless power transmitter 100*a* receives the maximum power signature periodically, for example, at least one signature every 2 seconds. If the maximum power signature is received, the wireless power transmitter 100*a* continues to provide 407 power and reconfigures its operating point and range if required. If the maximum power signature is not received as per its periodic rate, the wireless power transmitter 100*a* assumes that the wireless power receiver 100*b* has been removed or does not require further power. Hence, the wireless power transmitter 100*a* terminates transmitting power and shuts down 409 into a deep sleep after programming a timer to restore the wireless power transmitter 100*a* back to its normal operating mode after "T3" seconds.

While providing initial power, the wireless power transmitter 100*a* tracks parameters such as transmitter coil voltage VCoil, transmitter coil current ICoil, etc., to observe changes in the reflected impedance caused as a result of changes in the input impedance of the wireless power receiver 100*b*. In an embodiment, the wireless power transmitter 100*a* employs a peak detector mechanism to extract the envelope of the voltage and/or current that is in the transmitter coil 103, or the switch network 101, or other parts of the wireless power transmitter 100*a*. Embedded in the envelope of the voltage and/or current is the receiver-maximum-power-signature. Via its analog to digital converter (ADC) 302 exemplarily illustrated in FIG. 3, the wireless power transmitter 100*a* is aware of the extracted envelope of the voltage and/or current and hence, the wireless power receiver's 100*b* maximum power signature. Via its ADC 302, the wireless power transmitter 100*a* is also aware of the strength of the reflected impedance changes. The wireless power transmitter 100*a* uses this information to estimate the level of coupling between the wireless power transmitter 100*a* and the wireless power receiver 100*b*. In a second embodiment, the wireless power transmitter 100*a* employs a zero crossing detector mechanism to extract the phase difference between the voltage and current that is in the transmitter coil 103, or the switch network 101, or other parts of the wireless power transmitter 100*a*. Embedded in the phase difference between the voltage and the current is the receiver-maximum-power-signature. The wireless power transmitter 100*a* observes the variations in the phase difference to extract the receiver-maximum-power-signature. The wireless power transmitter 100*a* also observes the magnitude of these phase difference variations. The wireless power transmitter 100*a* uses this magnitude information to estimate the level of coupling between the wireless power transmitter 100*a* and the wireless power receiver 100*b*.

By incorporating the self-regulating wireless power receiver 100*b*, the receiver-maximum-power-signature algorithm and the simplified, limited operating point wireless power transmitter 100*a*, the method and the system disclosed herein allow building of a wireless power system 100 that provides stable, safe, and efficient wireless power to an electronic device without the need for a conventional communication protocol messages between the wireless power transmitter 100*a* and the wireless power receiver 100*b*.

The foregoing examples have been provided merely for the purpose of explanation and are in no way to be construed as limiting of the present invention disclosed herein. While the invention has been described with reference to various embodiments, it is understood that the words, which have been used herein, are words of description and illustration, rather than words of limitation. Further, although the invention has been described herein with reference to particular means, materials, and embodiments, the invention is not intended to be limited to the particulars disclosed herein; rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention in its aspects.

I claim:

1. A wireless power system comprising:
   a wireless power transmitter configured to transmit wireless power; and
   one or more self-regulating wireless power receivers configured to receive wirelessly transmitted power, said one or more wireless power receivers each comprising:
      an auto-tuning network operably coupled within said wireless power receiver, said auto-tuning network configured to control and regulate said received wirelessly transmitted power, and
      a rectifier operably coupled within said wireless power receiver, said rectifier configured to convert the said received wirelessly transmitted power from alternating current (AC) power into direct current (DC) power;
   wherein said auto-tuning network in said wireless power receiver is configured to detect changed in one or both of a load of said rectifier and an output voltage of said rectifier, and to dynamically counteract said detected changed if the changed exceed a safe operating range, said auto-tuning network counteracts said unsafe changes by dynamically tuning its network.

2. The wireless power system of claim 1, wherein said auto-tuning network in said wireless power receiver comprises an impedance network, said impedance network dynamically configured to one of increase, decrease, and maintain amount of said received wirelessly transmitted power.

3. The wireless power system of claim 2, wherein said impedance network of said auto-tuning network in said wireless power receiver comprises one or more of passive electronic components, active electronic components, and electronic switches.

4. The wireless power system of claim 1, wherein said self-regulating wireless power receiver is configured to implement a receiver-maximum power-signature algorithm for enabling a wireless power transmitter to detect unsupported receivers and terminate transmission of power, wherein said receiver-maximum power-signature algorithm defines instructions for varying input impedance of said self-regulating wireless power receiver by a predefined amount for predetermined intervals of time, and wherein said input impedance of said self-regulating wireless power receiver is varied via impedance changes in said auto-tuning network of said self-regulating wireless power receiver.

5. The wireless power system of claim 4, wherein said wireless power transmitter is aware of the maximum power needs of said wireless power receiver via said receiver-maximum power-signature messages from said wireless power receiver, wherein said wireless power transmitter configures its operating point and range to transmit a required level of maximum wireless power to said wireless power receiver based on the received said maximum-power-signature message and an estimated level of magnetic field flux coupling between said wireless power transmitter and said wireless power receiver.

6. The wireless power system of claim 5, wherein said wireless power transmitter terminates said transmission of said wireless power to said wireless power receiver when said receiver-maximum power-signature messages are not periodically received.

7. The wireless power system of claim 1, wherein said wireless power transmitter does not contain one or both of a modulator/demodulator block and an out-of-band communication block configured to communicate conventional wireless power protocol messages to and from said self-regulating wireless power receiver, wherein said self-regulating wireless power receiver, via said auto-tuning network, is configured to regulate said wirelessly transmitted power from said wireless power transmitter without said communication of said conventional wireless power protocol messages to and from said modulator/demodulator block and said out-of-band communication block.

8. The wireless power system of claim 1, wherein said self-regulating wireless power receiver, via said auto-tuning network, is configured to receive said wirelessly transmitted power from a wireless power transmitter without establishing a conventional communication protocol with said wireless power transmitter.

9. A method for self regulating wireless power system, said method comprising:
providing a wireless power transmitter; and
providing one or more self-regulating wireless power receivers each comprising an auto-tuning network and a rectifier;
configuring said one or more self-regulating wireless power receivers to receive wirelessly transmitted power from said wireless power transmitter;
configuring said auto-tuning network in said wireless power receiver to control and regulate said received wirelessly transmitted power by detecting changes in one or both of a load of said rectifier and an output voltage of said rectifier, and dynamically counteracting said detected changes if the changes exceed a safe operating range by dynamically tuning its network.

10. The method of claim 9, wherein said auto-tuning network is comprising of an impedance network, wherein said impedance network is being dynamically configured to one of increase, decrease, and maintain amount of said received wirelessly transmitted power.

11. The method of claim 10, wherein said impedance network is comprising one or more of passive electronic components, active electronic components, and electronic switches.

12. The method of claim 9, further comprising implementing a receiver-maximum power-signature algorithm by said self-regulating wireless power receiver for enabling said wireless power transmitter to detect unsupported receivers and to configure its operating point to transmit a required level of maximum wireless power to said self-regulating wireless power receiver, wherein said receiver-maximum power-signature algorithm defines instructions for varying input impedance of said self-regulating wireless power receiver by a predefined amount for predetermined intervals of time, and wherein said input impedance of said self-regulating wireless power receiver is varied via impedance changes in said auto-tuning network of said self-regulating wireless power receiver.

13. The method of claim 9, wherein said self-regulating wireless power receiver, via said auto-tuning network, is configured to receive said wirelessly transmitted power from said wireless power transmitter that does not contain one or both of a modulator/demodulator block and an out-of-band communication block, that is used for communication of conventional wireless power protocol messages.

14. The method of claim 9, wherein said self-regulating wireless power receiver, via said auto-tuning network, is configured to receive said wirelessly transmitted power from said wireless power transmitter without establishing a conventional communication protocol with said wireless power transmitter, said conventional communication protocol comprising messages for increasing, decreasing, maintaining and stopping the wireless power transfer.

15. The method of claim 12, wherein said wireless power transmitter terminates said transmission of said wireless power to said wireless power receiver when said receiver-maximum power-signature messages are not periodically received.

* * * * *